United States Patent [19]
Delépine

[11] 3,932,737
[45] Jan. 13, 1976

[54] SPECTRUM ANALYZER ESTABLISHING A NONLINEAR FREQUENCY DISTRIBUTION OF POWER-DENSITY SPECTRA

[75] Inventor: Pierre Delépine, Paris, France

[73] Assignee: Thomson-CSF, Paris, France

[22] Filed: Nov. 5, 1973

[21] Appl. No.: 412,786

[30] Foreign Application Priority Data
Nov. 7, 1972  France .............................. 72.39348

[52] U.S. Cl. .............................. 235/152; 324/77 B
[51] Int. Cl.² .......................................... G06F 15/34
[58] Field of Search .......... 235/156, 152; 324/77 B, 324/77 D, 77 G; 181/.5 P, .5 F; 340/15.5 DS; 343/55 A

[56] References Cited
UNITED STATES PATENTS
3,566,035   2/1971   Noll et al. ......................... 324/77 X OTHER PUBLICATIONS
C. Bingham et al., "Modern Techniques of Power Spectrum Estimation," *IEEE Trans. on Audio & Electro*, June 1967, pp. 56–66.
G. C. Maling, Jr. et al., "Digital Determination of Third-Octave & Full-Octave Spectra of Acoustical Noise," *IEEE Trans. on Audio & Electro.*, June 1967, pp. 98–104.
P. D. Welch, "The Use of FFT for the Estimation of Power Spectra: A Method Based on Time Averaging Overshort, Modified Periodograms," *IEEE Trans. on Audio & El.*, June 1967, pp. 70–73.

*Primary Examiner*—David H. Malzahn
*Attorney, Agent, or Firm*—Karl F. Ross; Herbert Dubno

[57] ABSTRACT

Precalculated samples of a power-density spectrum, taken at equispaced frequencies, are converted into modified samples with a nonlinear (e.g. logarithmic) distribution by being selectively weighted with the aid of several groups of coefficients defining a series of overlapping windows of mutually different widths. The system determines the weighting coefficient whose position in the frequency band of any window is closest to that of a precalculated sample appearing within that window; for each window, any sample appearing therein is multiplied by its closest coefficient and the sum of the resulting products is then divided by a factor proportional to the width of the window.

9 Claims, 5 Drawing Figures

SPECTRUM ANALYZER ESTABLISHING A NONLINEAR FREQUENCY DISTRIBUTION OF POWER-DENSITY SPECTRA

The present invention relates to improvements in spectrum analysis systems for electrical signals.

Such systems give the spectral power density of the input signal in the form of frequency samples which are generally extracted from the spectrum at uniform frequency intervals. However, in certain cases, such as for example in the examination of signals received when listening to underwater noise, spectrum analysis with sampling at uniform frequency intervals is of little advantage by reason either of the unstable nature of the sources of this noise or the unstable nature of the propagating medium, or again because of relative movement between the sources and the receiver. In these cases it proves more useful to carry out spectrum analysis with non-uniform (e.g. logarithmic) sampling intervals.

The general object of my present invention therefore is to provide a system which utilizes a method of and means for enabling spectrum analysis to be performed with the use of non-uniform frequency-sampling intervals, in particular logarithmic intervals.

In the prior art, to obtain the spectral power density of an electrical signal, the discrete Fourier transform, or "DFT", coefficients of a temporal sequence of samples of the signal are generally calculated by, for example, using a fast-calculating algorithm such as that known under the name of "fast Fourier transform" or "FFT". The power-density spectrum is then made up of frequency samples which are regularly spaced along the frequency axis.

Furthermore, in order to make these sampling intervals non-uniform, and in particular to make them logarithmic, it is known from the article "Computation of spectra with unequal resolution using the Fast Fourier Transform" published in "Proceedings of the IEEE" of February 1971, pages 229 to 301, to modify the signal prior to the "FFT" (fast Fourier transform calculation major drawback of this technique is that it requires a large number of calculating operations.

I have found, in accordance with the present invention, that it is possible in such a system to reduce the number of calculating operations by carrying out certain processing steps after a determination of the spectral power density of the input signal.

To this end, the spectral power density is weighted by means of a succession of windows centered on nonuniformly spaced frequencies, the widths of these windows depending on their position along the frequency axis. It suffices to calculate, for each window, only the products of the samples of the spectral density of the signal falling within that window times the weighting values corresponding to the respective positions of the samples.

According to a feature of the present invention, the system includes a source of precalculated spectral samples, uniformly spaced over a predetermined frequency range, and a device for transforming the series of these uniformly distributed modified samples of the spectrum into a series of non-uniformly distributed samples.

According to a more particular feature of my invention, the transforming device calculates the nonuniformly distributed samples by weighting the uniformly spaced samples, which have been calculated beforehand, by means of coefficients which are distributed in accordance with the aforementioned succession of spectral windows which partially overlap in frequency and whose widths depends on the position of their center frequency, the sum of the weighted samples encompassed by the same window forming a new, non-uniformly distributed sample of the spectrum; in this system a minimum of calculating operations are performed by the transforming device inasmuch as for each separate weighting window only those weighting coefficients are used whose position in frequency is closest to that of the uniformly distributed spectrum samples encompassed by that window.

According to a still more specific feature of my invention, the transforming device comprises:

a random-access memory in which are stored the samples supplied by the means for calculating the spectrum with uniform frequency distribution, a second memory containing the weighting coefficients associated with the several weighting windows, a unit for calculating, for each separate window, the respective address of a uniformly distributed sample of the spectrum and of the weighting coefficient whose frequency position is closest to that of the associated sample, a multiplier circuit which respectively receives from these two memories, each time a new sample address and weighting-coefficient address are supplied to the memories by the address-calculating unit, a uniformly distributed sample and the weighting coefficient whose frequency position is closest to that of the associated sample, a summation circuit which receives the products supplied by the multiplier circuit and, for each separate weighting window, supplies to an output buffer register a value equal to the sum of the weighted samples encompassed by the window, which forms a new, non-uniformly distributed spectrum sample, and a unit which supplies timing signals to the address-calculating unit and to the summation circuit and the output buffer register.

The invention will now be further described, by way of example, with reference to the accompanying drawing in which:

FIG. 1 is a diagram, drawn to an arbitrary scale, showing the modification of precalculated equispaced spectral samples in accordance with the invention. The following description will be concerned more specifically with the case of spectrum analysis on a logarithmic scale, i.e. a system where $$Q = \frac{f_o}{B}$$

is a constant, $B$ being the width of a frequency band being analyzed and $f_o$ being the center frequency of that band. It is however to be understood that the invention also applies to any other type of spectrum analysis in which sampling takes place at non-uniform intervals. In the following description, the spectral power density of a signal will be simply termed the spectrum.

My improved processing technique applies to frequency samples of the spectrum of the signal being analyzed, these samples having been calculated beforehand by any known means such, for example, as an "FFT" calculator followed by quadratic detection. The required result is similar to that which would be given by a spectrum analyzer made up of a bank of logarithmic filters, i.e. one in which $$Q = \frac{f}{B}$$

is a constant. These filters would thus be such that their frequency band and the gap between the samples of their spectrum would be proportional to frequency, two successive filters differing in bandwidth from each other according to a ratio R satisfying the relationship:

$$R = \frac{\sqrt{1+4Q^2}+1}{\sqrt{1+4Q^2}-1} \simeq 1 + \frac{1}{Q} \text{ with } Q \gg 1$$

The modification of the original samples according to the invention consists in weighting the spectrum of the input signal by means of a succession of windows representing such a bank of filters.

According to one aspect of the invention, these windows are defined by a discrete predetermined weighting function constituted by a limited whole number $2M$ of finite or non-zero coefficients equispaced within the respective frequency band; the spectral width of each window depends on the position of its center frequency. The width of any two successive windows are related to each other as the terms of a geometrical progression of constant ratio $$R = 1 + \frac{1}{Q},$$

wherein $Q$ has the aforementioned value ($f/B$) with $f$ representing their center frequencies, adjoining windows intersecting at points of predetermined attenuation such as, for example, at their 3-dB points.

Figure 1:
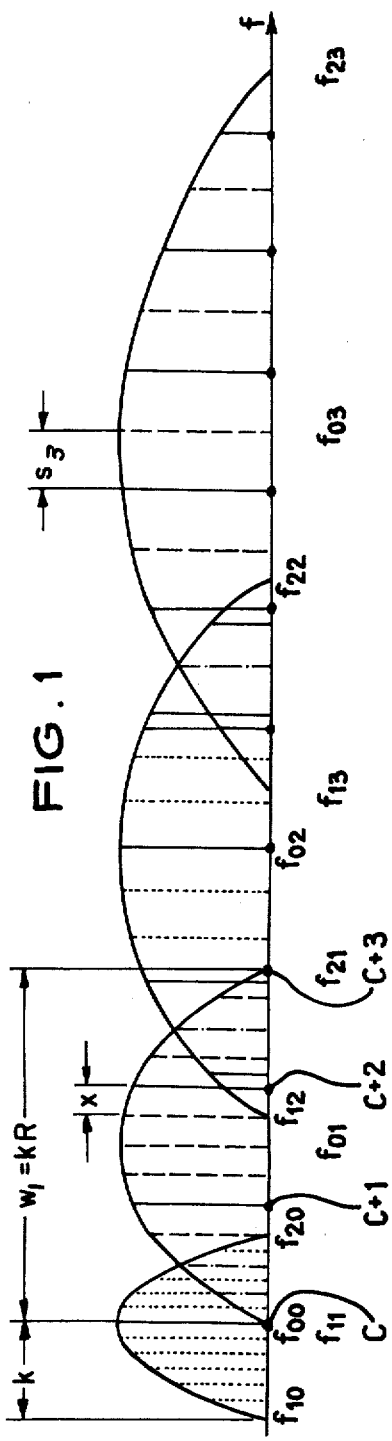
FIG. 1 is a diagram of the spectral power density of an electrical signal, serving to illustrate the processing steps carried out in accordance with the invention.

The position of the first weighting window employed for processing according to the invention is assumed to be centered on the frequency $f_{oo}$ which corresponds to the sample of the signal spectrum in position C, as shown in FIG. 1; its width is equal to $2k$. The frequency interval at which the spectrum is sampled has been selected as unity. The window is defined by $2M$ discrete values contained in a memory of the "read only" type, for example, $M$ being a positive whole number.

The system according to the invention ascertains, for each successive window, the addresses of the samples of the spectrum encompassed by the frequency band of that window and the addresses of the discrete values of the latter (i.e. the weighting coefficients thereof) which best correspond to the position of these samples, namely the locations of those samples and coefficients within the overall frequency range. The samples of the spectrum and the corresponding discrete weighting coefficients are then extracted from their respective memories in order to form their product and then summing the products obtained for each window.

As a result of the constant ratio R between the widths and positions of successive windows, it can be shown that the parameters of a given window of rank $i$ are defined as follows (with $i = 0$ for the first window referred to above):

the address of the minimum frequency below which all the discrete values are 0:
$$f_{1i} = (C - k) R^i$$
the address of the center frequency:
$$f_{0i} = CR^i$$
the width: $w_i = 2kR^i$
the coefficient spacing in terms of frequency:

$$S_i = \frac{kR^i}{M}.$$

The address of the first sample of the spectrum covered by this window is therefore $d_1 = 1 + $ whole $[(C-k)R^i]$ which means: 1 + the whole-number or integral portion of $(C-k)R^i$.

The value of an interval $x$ on the frequency axis between the lower limit $f_{1i}$ of this window and the first sample of the spectrum covered by the same window is
$x = 1 - \text{frac } [(C-k)R^i]$,
which means $x = 1 - $ the fractional portion of $(C-k)R^i$.

The address of the value of the discrete weighting coefficient associated with this window which best corresponds to the first sample of the spectrum encompassed by the window is close to:

$$e_1 = \frac{Mx}{kR^i} = M \frac{1 - \text{frac }[(C-k)R^i]}{kR^i}.$$

This address is made equal to:

$$m_1 = \text{whole} \left[ \frac{1}{2} + M \frac{1 - \text{frac }[(C-k)R^i]}{kR^i} \right]$$

which is simply the whole number closest to $$e_1 = \frac{Mx}{kR^i}$$

The operation which consists in going from $e_1$ to $m_1$ is known as rounding-off. For the $j$th sample of the spectrum encompassed by this window, the address of the appropriate discrete weighting coefficient is $$m_j = \text{whole} \left[ \frac{1}{2} + M \frac{j - \text{frac }[(C-k)R^i]}{kR^i} \right].$$

When $m_j$ becomes greater than $2M$, this indicates that all the samples of the spectrum encompassed by the window of rank $i$ have been explored and it is possible to pass on to the next window in position $i+1$.

The four overlapping windows particularly shown in FIG. 1, representing ranks 0–3, are thus centered on respective midfrequencies $f_{00}$, $f_{01}$, $f_{02}$, $f_{03}$ and are bounded by lower and upper limiting frequencies $f_{10}$ and $f_{20}$, $f_{11}$ and $f_{21}$, $f_{12}$ and $f_{22}$, $f_{13}$ and $f_{23}$. The frequency positions of the precalculated samples, which may be generally designated $C+h$ ($h$ being an integer), have been partly indicated at C, C+1, C+2 and C+3. The width $w_i$ has been specifically shown at $w_1=kR$ for the second window ($i=1$); the coefficient spacing $s_i$ has been indicated for the fourth window at $s_3$.

Figure 2:
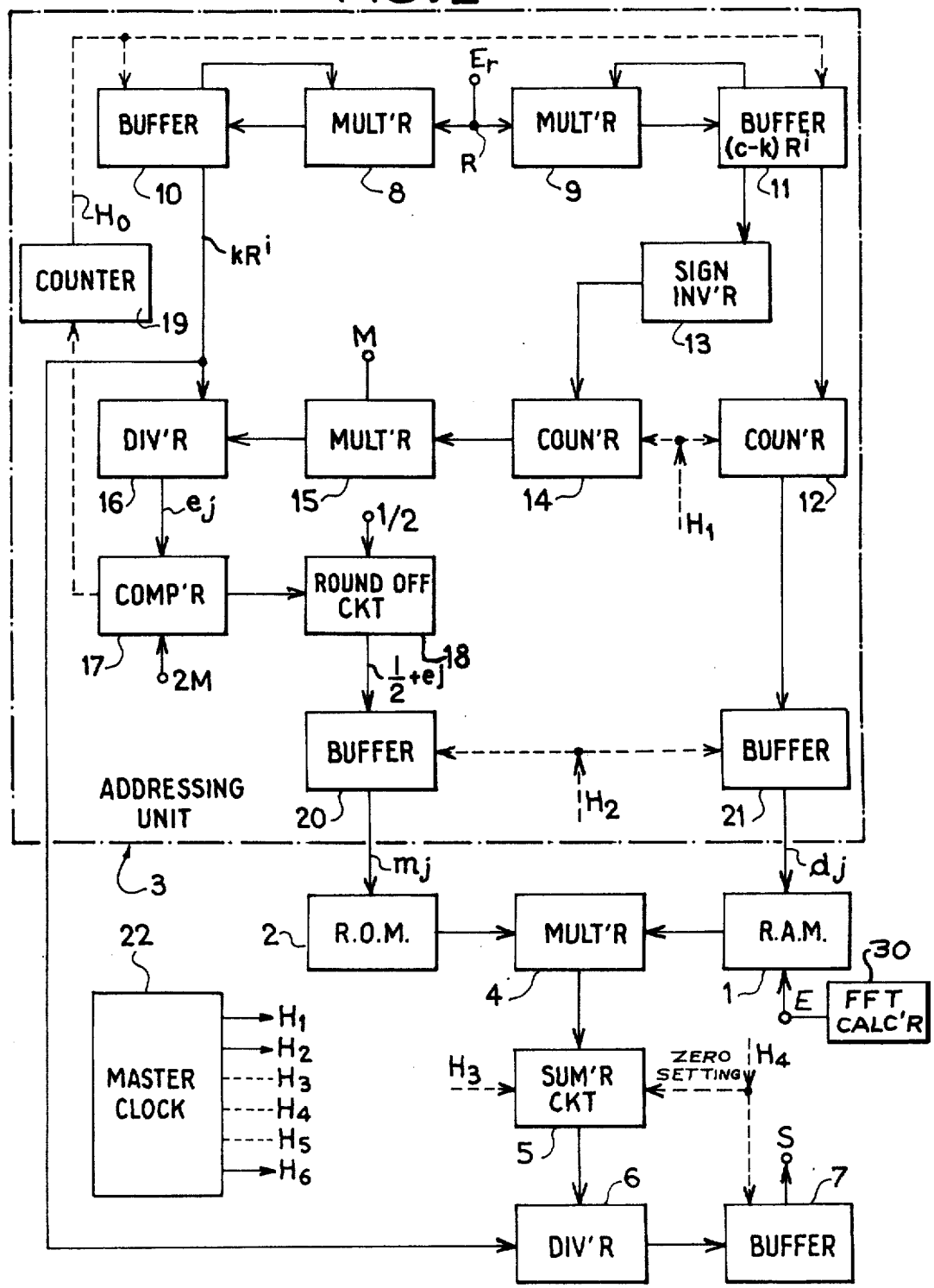
FIG. 2 is a block diagram of a spectrum-analysis system in accordance with the invention.

FIG. 2 shows a block diagram of one embodiment of a spectrum-analysis system in accordance with the invention. This system, which enables my above-described method of spectrum analysis to be put into effect, includes a signal source in the form of a random-access memory 1 in which have been stored the spectrum samples of the signal being analyzed, which were applied to an input terminal E, these samples having been obtained beforehand from a conventional calculator or computer unit 30 using the aforementioned "FFT," or fast fourier transform, algorithm. It also incorporates a second memory 2, of the "read only" type, for example, which serves as a store for the 2M discrete values or coefficients associated with the first spectral weighting window of rank $i=0$.

Furthermore, an arithmetic or addressing unit 3 controls the selective readout of specific contents of each of the memories 1 and 2. The data selected are applied to a multiplier 4 which supplies the product thereof to a summation circuit 5 controlled by a signal $H_3$ from a master clock 22. A buffer register 7 having an output S, which carries the modified spectral samples, is controlled by a timing signal $H_4$ from clock 22 and accepts data from the summation circuit 5. Where the spectral density is constant, a normalization divider 6 is also advantageously arranged between the data summation circuit 5 and the buffer register 7, for dividing the contents of summing circuit 5 by a factor proportional to the width of the corresponding window (specifically the value $kR^i$) to determine the mean power density of each window. In order not to encumber the diagram of FIG. 2, the arithmetic unit 3 is shown in a schematic and simplified fashion, and the memories which supply the value of ratio R and the discrete values of the numbers M and 2M have been omitted. The master clock 22 also supplies additional control signals $H_1$, $H_2$, $H_5$ and $H_6$ referred to hereinafter (signals $H_5$ and $H_6$ apply only to the modification of FIG. 4).

Unit 3 includes an input terminal E$r$, connected to one of the nonillustrated memories, via which the value of ratio R is simultaneously applied to respective first inputs of two multipliers 8 and 9. The output of multiplier 8 is connected to an input of a buffer register 10 which is controlled by a timing signal $H_0$ and which contains the values $kR^i$ serving to determine the width $2kR^i$ of any window and to establish the corresponding sampling interval $$\frac{kR^i}{M}$$

used to arrive at the address $m_j$ of a particular weighting coefficient. An output of this register 10 feeds back its contents to a second input of multiplier 8 which thus receives the contents of register 10.

The other multiplier 9 is connected in a similar configuration to another buffer register 11 which is controlled by the same signal $H_o$ and contains the values $(C - k)R^i$ which relate to the address of the lower limiting frequency $f_{1i}$ and which are mainly used to arrive at the address $d_j$ of the sample in position $C + .h$ to be processed.

To this end, a second output of register 11 transmits the whole-number portion of this value $(C-k)R^i$ to a presetting input of a counter 12 which is controlled by timing signal $H_1$. Each time a timing pulse $H_1$ is received by the counter 12, the value whole $[(C - k)R^i]$ registered by the counter is increased by one unit. The output of this counter 12 is connected to a buffer register 21 which is controlled by timing signal $H_2$. It is this register which supplies to the memory 1 the address $d_j$ of the sample of the spectrum selected for the weighting calculation.

The fractional portion of value $(C-k)R^i$ contained in register 11 is fed by a third output thereof, after its sign has been changed in an interverting circuit 13, to the presetting input of a second counter 14 which is also controlled by timing signal $H_1$. The output of this counter 14 is connected to the dividend input of a dividing circuit 16, via a multiplier 15 which multiplies the contents of counter 14 by the value M received at another second input terminal therefore. The divisor input of circuit 16, and similarly that of averaging circuit 6, receives the value $kR^i$ contained in the buffer register, this value representing half the width of the window 10. A comparison circuit 17 with two inputs and two outputs receives on the one hand the value $e_j$ supplied by the divider 16 and, on the other hand, the reference value 2M, these two values being compared. When $e_j$ is less than 2M, this value is rounded off by being applied to an adder 18 which receives from another source the value ½, the whole-number portion of ½ + $e_j$ being stored on its own in a buffer register 20 controlled by timing signal $H_2$. It is this register 20 which supplies to memory 2 the address $m_j$ of the discrete weighting coefficient which best corresponds to the sample of the spectrum whose address is $d_j$. When value $e_j$ becomes equal to or greater than 2M, the comparator 17 actuates a counter 19 which indicates the position of the weighting window in use and triggers the timing pulse $H_0$ which loads the registers 10 and 11.

Figure 3:
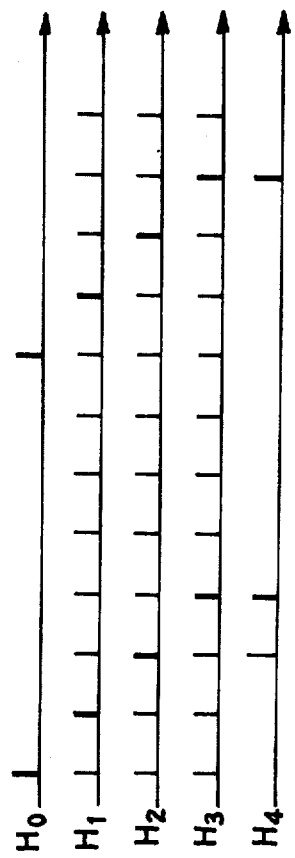
FIG. 3 is a set of graphs representing timing signals used to control the system shown in FIG. 2.

The relative time positions of the timing signals $H_0$ to $H_4$ are shown in FIG. 3.

The processing according to the invention by means of the system shown in FIG. 2 takes place recurrently. For the first weighting window employed, i.e. with $i=0$, the registers 10 and 11 have been loaded beforehand with values $k$ and $C-k$, respectively. I shall describe the operation of the system of FIG. 2 with specific reference to a window for which $i \neq 0$, it being assumed that the calculations relating to the windows of ranks 0 to $i-1$ have already been performed in a similar way. The completion of the calculation relating to the window of rank $i-1$ gives rise to a timing pulse $H_0$ which causes the contents of registers 10 and 11 to be altered by multiplying the values $kR^{i-1}$ and $(C - k)R^{i-1}$, previously stored therein, by the magnitude R. At the same time, the counters 12 and 14 are reset to new values whole $[(C - k)R^i]$ and $-$ frac $[(C - k)R^i]$, respectively.

When the next timing pulse $H_1$ occurs following timing pulse $H_0$, the counter 12 contains the value 1 + whole $[(C - k)R^i]$ which represents the address $d_1$ of the first sample of the spectrum encompassed by the window of rank $i$.

Simultaneously with this calculation of address $d_1$ there is performed that of the address $m_1$ of the corresponding discrete value partly defining the new window. For this purpose, the value 1−frac $[(C - k)R^i]$ is multiplied by M in unit 15 before being divided by $kR^i$ in unit 16. The value $e_1$ thus obtained is compared with 2M. When $e_1$ is less than 2M, this value is rounded off in unit 18 to the nearest whole number which then forms the desired address $m_1$, a timing pulse $H_2$ causing this value $m_1$ to be fed into buffer register 20.

Simultaneously, the same timing pulse $H_2$ causes the address $d_1$ to be entered in buffer register 21. The corresponding coefficients are then extracted from memories 1 and 2 before being multiplied with each other in multiplier 4. A timing pulse $H_3$ then causes the product obtained to be fed into the data-summation circuit 5. The periodicity of the timing signal $H_3$ is the same as that of timing signals $H_1$ and $H_2$ and the summation circuit 5 thus sums the products for each separate window. Each new timing pulse $H_1$ causes the address $d_1$ to be increased and a new address $m$ to be calculated, this calculation taking place in a manner similar to that described for value $m_1$. Thus, the $j+$ 1st timing pulse $H_1$ relating to the window of rank $i$ gives $d_j = j +$ whole $[(C - k)R^i]$ and $m_j =$ whole $[½ + e_j]$ where $$e_j = M \frac{j - \text{frac}\,[(C-k)\,R^i]}{kR^i}$$

If $e_j$ is less than 2M, the process is the same as for $m_1$.

On the other hand, if $e_j$ is greater than 2M, this value is not transmitted to adder 18 and a new timing pulse $H_0$ appears which advances the counter 19 and causes the calculation relating to the following window of rank $i+1$ to commence. The summation circuit 5 then contains the sum of the products relating to the window of rank $i$. This sum is normalized with respect to $kR^i$ in divider 6 before being fed into the output buffer register 7 at the command of a timing pulse $H_4$, this pulse at the same time causing the summation circuit 5 to be reset to zero. Register 7 then contains a value which corresponds to a modified sample of the logarithmic spectrum of the signal being analyzed, lying in the frequency band of the window of rank $i$. The calculation is continued in a similar way for each of the remaining samples and is concluded when the last position has been reached, i.e. when $i = n$ as previously selected, which is determined, for example, as a result of the counter 19 being overrun. The foregoing description relates to an extremely simple embodiment of my invention.

A more elaborate embodiment will now be described with reference to FIGS. 4 and 5.

Figure 4:
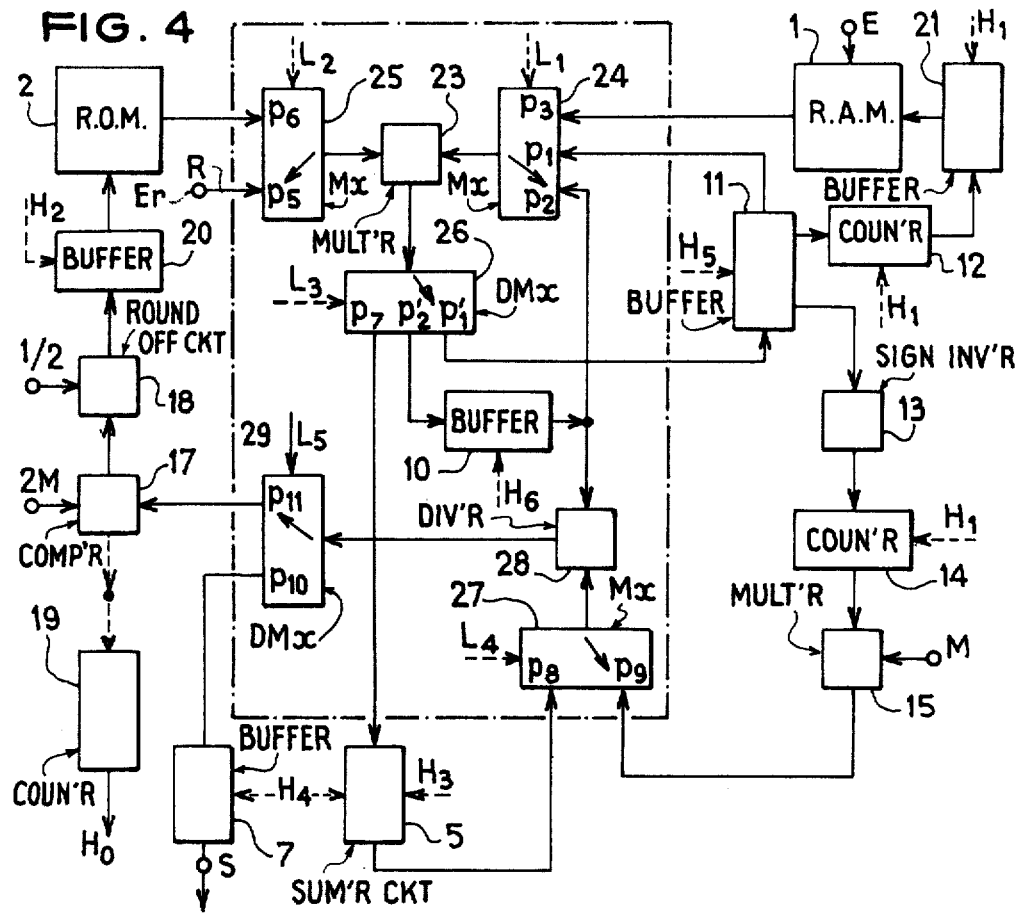
FIG. 4 is a block diagram of another embodiment of a system according to the invention.

As in the case of FIG. 2, FIG. 4 is schematic and simplified, with similar components designated by the same reference numerals. Control signals $L_1$ to $L_5$ are generated by means not shown, e.g., trigger circuits responsive to signals from master clock 22 (FIG. 2).

It should be noted that the system shown in FIG. 4, in contrast to that of FIG. 2, has a single multiplier 23 and a single divider 28. A multiplexer 24 having three positions $p_1$, $p_2$ and $p_3$, which is controlled by signal $L_1$, connects an input of the multiplier 23 first to the output of register 11, here controlled by timing signal $H_5$, then to the output of register 10, here controlled by timing signal $H_6$, and finally to the output of memory 1. A second multiplexer 25 having two positions $p_5$ and $p_6$, which is controlled by a signal $L_2$, applies to a second input of this multiplier 23 first the magnitude of ratio R and then the output of memory 2. The output of this multiplier 23 is connected by a demultiplexer 26, which has three positions $p'_1$, $p'_2$ and $p_7$ and is controlled by a signal $L_3$, first to the input of register 11, then to that of register 10 and finally to the input of summation circuit 5. Components 12 and 14, which respectively contain the integral, and the inverted fractional portion of value $(C - k)R^i$, consist of binary digital counters which are incremented by one unit each time a fresh timing pulse $H_1$ is applied to them. The sign-changing device 13 consists of a conventional binary complementing circuit. Multiplication by value M is performed by a conventional binary circuit 15 which produces a binary shift by a fixed quantity equal to $\log_2 M$, where M is equal to a power of 2. A multiplexer 27, which has two positions $p_8$ and $p_9$ and is controlled by a signal $L_4$, connects first the output of this unit 15 and then the output of summation circuit 5 to the dividend input of divider circuit 28. The output of this circuit 28 is connected by a demultiplexer 29, which has two positions $p_{10}$ and $p_{11}$ and is controlled by a signal $L_5$, first to an input of comparator 17 and then to the output buffer register 7.

Figure 5:
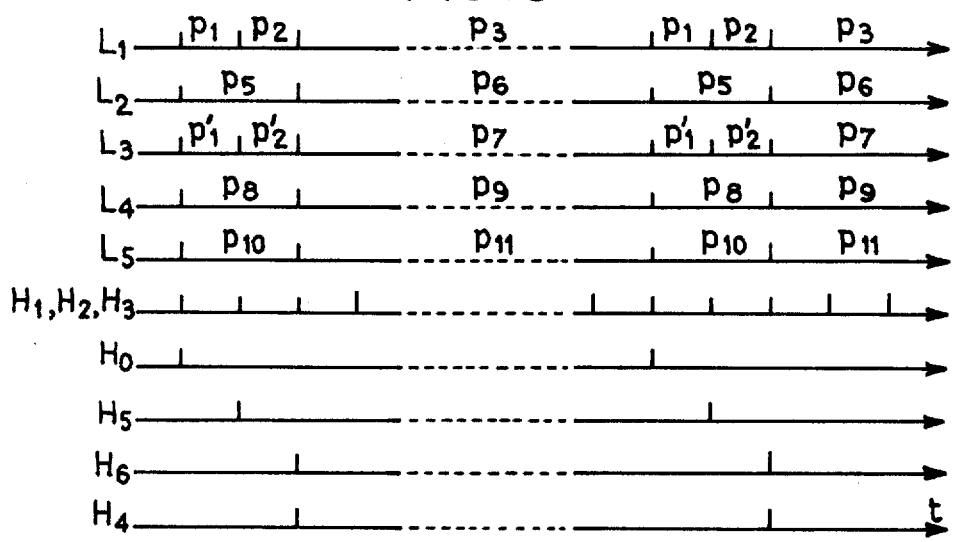
FIG. 5 is a set of graphs representing various control signals for the embodiment of FIG. 4.

The timing signals $H_1$ $H_2$ and $H_3$ of FIG. 5 are similar to those of FIG. 3. As for the signals $L_1$ to $L_5$, these are represented in FIG. 5 by graphs showing the positions to which the corresponding multiplexers and demultiplexers are switched.

For the purpose of describing the operation of the system of FIG. 4, it will again be assumed that the calculations for $i=0$ to $i = 1$ have already been performed. A timing pulse $H_0$ triggered by the comparator 17 at the end of the calculation relating to rank "$i - 1$" has, by means of control signals $L_1$ to $L_5$, caused the multiplexers and demultiplexers 24, 25, 26, 27 and 29 to be switched to their respective starting positions $p_1$, $p_5$, $p'_1$, $p_8$ and $p_{10}$. The value $(C - k)R^{i-1}$ contained in register 11 is then applied to multiplier 23, which receives the value R from another source connected to its input E$r$. A timing pulse $H_5$ then causes the value $(C - k)R^i$ so calculated to be stored in register 11. The demultiplexer 24 and the multiplexer 26 are then switched by signals $L_1$ and $L_3$ to their positions $p_2$, $p'_2$ which enables $kR^i$ to be calculated. A timing pulse $H_6$ then causes this value to be entered in register 10. At the same time, multiplexers 24, 25 and 27 and demultiplexers 26 and 29 are switched to their respective positions $p_3$, $p_6$, $p_9$, $p_7$ and $p_{11}$. Addresses $d_1$ to $d_j$ and $m_1$ to $m_j$ are then calculated in a way similar to that described for the system of FIG. 2, until comparator 17 detects that $e_j$ has exceeded 2M, which causes a fresh timing pulse $H_0$ to appear and the calculation relating to rank "$i + 1$" to begin. While values $(C - k)R^i$ and $kR^i$ are being elaborated, the multiplexer 27 is in position $p_8$ and demultiplexer 29 is in position $p_{10}$, which means that the values contained in summation circuit 5 relating to rank $i$ are then normalized before being stored in the output buffer register 7.

There has thus been described a system which provides a method of and means for enabling a spectrum analysis, having a constant frequency-sampling interval, to be converted into an analysis having logarithmic intervals. In the most general case, in which the intervals need not have a specific distribution, it is merely necessary to alter the value of ratio R between the successive windows each time the window changes. In the case of the systems shown in FIGS. 2 and 4, the value R would then be extracted from a read-only memory, containing as many values R as there are separate weighting windows, each time a fresh pulse $H_0$ has occurred.

By way of example, assuming the same speed of calculation, a system according to the invention as shown in FIG. 4 would enable the number of components employed to be reduced by a ratio of 3 in comparison with a conventional system using the method of signal modification prior to analysis, as noted above.

Of course, the invention is not limited to the embodiments described and shown which have been given solely by way of example.

What is claimed as new and desired to be secured by Letters Patent of the United States is:

1. A spectrum analyzer for electrical signals, comprising:
    a source of precalculated spectral samples equispaced over a predetermined frequency range;
    conversion means connected to said source for transforming said precalculated samples into modified samples nonuniformly distributed over said frequency range, said conversion means including a store of weighting coefficients divided into groups which define a plurality of spectral windows along said frequency range, said windows differing in width from one another, said conversion means further including calculating means connected to said source and to said store; and
    addressing means connected to said store for ascertaining the presence of any precalculated sample in the frequency band of each window and determining the respective weighting coefficient closest to each precalculated sample in any window;
    said calculating means being connected to said addressing means for modifying each precalculated sample in accordance with the magnitude of the respective closest weighting coefficient.

2. A spectrum analyzer as defined in claim 1 wherein said calculating means includes multiplier means connected to said source and said store for providing the product of each precalculated sample times the respective closest weighting coefficient and summing means connected to said multiplier means for adding up the products so provided within each window.

3. A spectrum analyzer as defined in claim 2 wherein said calculating means further includes divider means connected to said summing means for averaging the sum of said products over the width of each window.

4. A spectrum analyzer as defined in claim 2 wherein said conversion means further includes timing means for repetitively actuating said multiplier means and said summing means to operate successively on precalculated samples and weighting coefficients located within different windows.

5. A spectrum analyzer as defined in claim 4 wherein said windows overlap and have widths proportional to their center frequencies.

6. A spectrum analyzer as defined in claim 5 wherein the widths of any pair of adjoining windows have a constant ratio R, each window being defined by a fixed number 2M of weighting coefficients equispaced within its frequency band, said addressing means including a first and a second register controlled by said timing means for respectively storing a first value $kR^i$ and a second value $(C - k)R^i$ wherein $i$ denotes the rank of a window being processed, C is the central frequency of the first window having the rank $i=0$, and $k$ is half the width of said first window, said addressing means further including arithmetic means connected to said first and second registers for determining the time positions of any precalculated sample and of the closest weighting coefficient within the window of rank $i$ from said first and second values.

7. A spectrum analyzer as defined in claim 6 wherein said arithmetic means comprises first counting means connected to said second register for receiving an integral portion of said second value, second counting means connected to said second register for receiving an inverted fractional portion of said second value, said first and second counting means being further connected to said timing means for periodic stepping thereby, a multiplication circuit connected to said second counting means for multiplying said fractional portion by the integral number M, and a division circuit connected to said first register and to said multiplication circuit for dividing the output of the latter by said first value, said source being connected to said first counting means for receiving therefrom the address of a precalculated sample to be read out to said multiplier means, said store being connected to said division circuit for receiving therefrom the address of a weighting coefficient to be read out to said multiplier means.

8. A spectrum analyzer as defined in claim 7, further comprising a rounding-off circuit inserted between said store and said division circuit for augmenting the output of the latter by a constant equal to half the spacing of said precalculated samples.

9. A spectrum analyzer as defined in claim 7 wherein said timing means includes comparison means connected to said division circuit for comparing the output thereof with said fixed number 2M and for switching said calculating means to the next-ranking window upon the last-mentioned output exceeding 2M.

* * * * *